United States Patent
Yi et al.

[11] Patent Number: 5,874,730
[45] Date of Patent: Feb. 23, 1999

[54] OPTICAL PICKUP EMPLOYING A VERTICAL CAVITY SURFACE-EMITTING LASER DIODE

[75] Inventors: You-shin Yi; Hyun-kuk Shin, both of Suwon, Rep. of Korea

[73] Assignee: Samsung Electronics Co., Ltd., Kyungki-do, Rep. of Korea

[21] Appl. No.: 672,047

[22] Filed: Jun. 26, 1996

[30] Foreign Application Priority Data

Jun. 30, 1995 [KR] Rep. of Korea .................. 1995-19044

[51] Int. Cl.[6] ........................................................ H01J 40/14
[52] U.S. Cl. ..................... 250/214 R; 250/551; 250/225; 369/121
[58] Field of Search .............................. 250/214 R, 214.1, 250/239, 551, 225; 257/433; 359/15, 575; 369/103, 110, 112, 121, 44.12, 44.37

[56] References Cited

U.S. PATENT DOCUMENTS

| | | | |
|---|---|---|---|
| 5,285,466 | 2/1994 | Tabatabaie | 372/50 |
| 5,331,621 | 7/1994 | Miyake et al. | 359/15 |
| 5,406,543 | 4/1995 | Kobayashi et al. | 250/551 |
| 5,483,511 | 1/1996 | Jewell et al. | 369/44.37 |
| 5,561,683 | 10/1996 | Kwon | 359/575 |

FOREIGN PATENT DOCUMENTS

| | | |
|---|---|---|
| 0 348 950 | 1/1990 | European Pat. Off. . |
| 0 390 445 | 10/1990 | European Pat. Off. . |
| 44 04 635 | 8/1994 | Germany . |

OTHER PUBLICATIONS

Patent Abstracts of Japan, vol. 095, No. 010, Nov. 30, 1995, & JP 07 0192291 A(Matsushita Electric Ind Co Ltd), Jul. 28, 1995 *Abstract.

*Primary Examiner*—Que T. Le
*Attorney, Agent, or Firm*—Sughrue, Mion, Zinn, Macpeak & Seas, PLLC

[57] ABSTRACT

An optical pickup is provided which detects information contained in an optical disk. The optical disk includes a light source, a hologram device, an objective lens, a photodetector, and a single chip. The light source is formed of a first vertical cavity surface-emitting laser (VCSEL) diode and emits a light beam. The hologram device converts the light beam emitted from said light source into a polarized parallel light beam and diffracts a reflected parallel light beam reflected from said optical disk to produce a diffracted beam. The objective lens focuses the polarized parallel light beam on said optical disk and converts a corresponding reflected beam into the parallel reflected beam. The photodetector is formed of a second VCSEL diode and detects various characteristics of the diffracted beam. Finally, the light source and the photodetector are integrated on the chip. As a result of the configuration above, the light source emits a laser beam which has a small astigmatism and does not lose its intensity as it propagates through the optical head.

31 Claims, 6 Drawing Sheets

OPTICAL PICKUP EMPLOYING A VERTICAL CAVITY SURFACE-EMITTING LASER DIODE

FIELD OF THE INVENTION

The present invention relates to an optical pickup device. More particularly, the present invention relates to an optical pickup employing a vertical cavity surface-emitting laser (VCSEL) diode as a light source.

BACKGROUND OF THE INVENTION

FIG. 1 illustrates a optical system having a conventional optical pickup which is used in a compact disk player. Specifically, the pickup comprises a printed circuit board (PCB) 1, a submount 2, an edge-emitting laser diode 3, a photodetector 4, and a photo diode 8. The submount 2 is mounted on the PCB 1, and the laser diode 3 is fixedly disposed on the side of the submount 2 and used as a light source for the optical pickup. The photo diode 8 is disposed on the PCB 1 next to the submount 2, intersects a line which is collinear with the optical axis of the edge-emitting laser diode 3, and senses the amount of light output from the diode 3. The photodetector 4 is also installed on the PCB 1 and detects light which has been emitted from the diode 3 and reflected from an optical disk 7.

The optical pickup further comprises a hologram device 5 and an objective lens 6. Specifically, the hologram device 5 and the objective lens intersect the optical axis of the diode 3 and are located between the diode and the disk 7.

The operation of the conventional optical pickup will be described below. First, the laser diode 3 emits a laser beam which has multiform polarization directions, and such beam impinges upon the hologram device 5. The device 5 converts the laser beam into a parallel light beam and outputs such beam to the objective lens 6. Then, the lens 6 focuses the light beam upon a particular track of the disk 7.

The focused beam reflects off the track of the optical disk 7, and the polarization of the light beam varies according to information recorded in the track. Subsequently, the reflected beam passes through the objective lens 6, is converted into a parallel beam, and is output to the hologram device 5. Then, the device diffracts the reflected beam and outputs the diffracted beam to the photodetector 4. Consequently, the photodetector 4 determines the type of information recorded on the track of the disk 7 based on the shape and/or intensity of the diffracted beam. Furthermore, the photodetector 4 evaluates the beam to determine if the beam is properly positioned on the track of the disk and if the beam is properly focused on the disk 7.

The conventional optical pickup has several disadvantages. For example, since the edge-emitting laser diode 3 is fixed to the submount 2, aligning the optical axis of the diode 3 with the hologram device 5 and aligning the photodetector 4 with the diffracted beam is difficult. As a result, a substantial amount of time is need to assemble the optical pickup.

Furthermore, the edge-emitting laser diode 3 emits a laser beam which has an oval cross section and a large astigmatism. Therefore, correctly detecting tracking errors via the photodetector 4 is difficult. Moreover, the intensity of the light reaching the surface of the disk significantly decreases as the laser beam passes through the optical system.

SUMMARY OF THE INVENTION

It is an object of the present invention to provide an optical pickup which employs a light source and a photodetector integrated into a single chip for detecting enough light reflected from an optical disk.

Another object of the present invention is to provide an optical pickup which uses a laser beam having small astigmatism to reduce loss of light intensity in an optical system.

To achieve the above objects, there is provided a hologram optical pickup according to the present invention, comprising, a light source formed of a VCSEL diode, photodetector formed of the VCSEL diode for detecting light reflected from an optical disk, a chip having the light source and the photodetector integrated thereon, a hologram device for changing light emitted from the light source into polarized parallel light and for diffracting the light reflected from the disk to the photodetector, and an objective lens for focusing the light transmitted through the hologram device on the optical disk, wherein the VCSEL diode used as the light source is formed of lower reflection mirror layers, a lower spacer layer on the lower reflection mirror layers, an activated layer on the lower spacer layer, an upper spacer layer on the activated layer, upper reflection mirror layers on the upper spacer layer, and the VCSEL diode used as the photodetector is formed identical to the light source.

BRIEF DESCRIPTION OF THE DRAWINGS

The above objects and advantages of the present invention will become more apparent by describing in detail a preferred embodiment thereof with reference to the attached drawings in which.

DETAILED DESCRIPTION OF THE INVENTION

Figure 1:
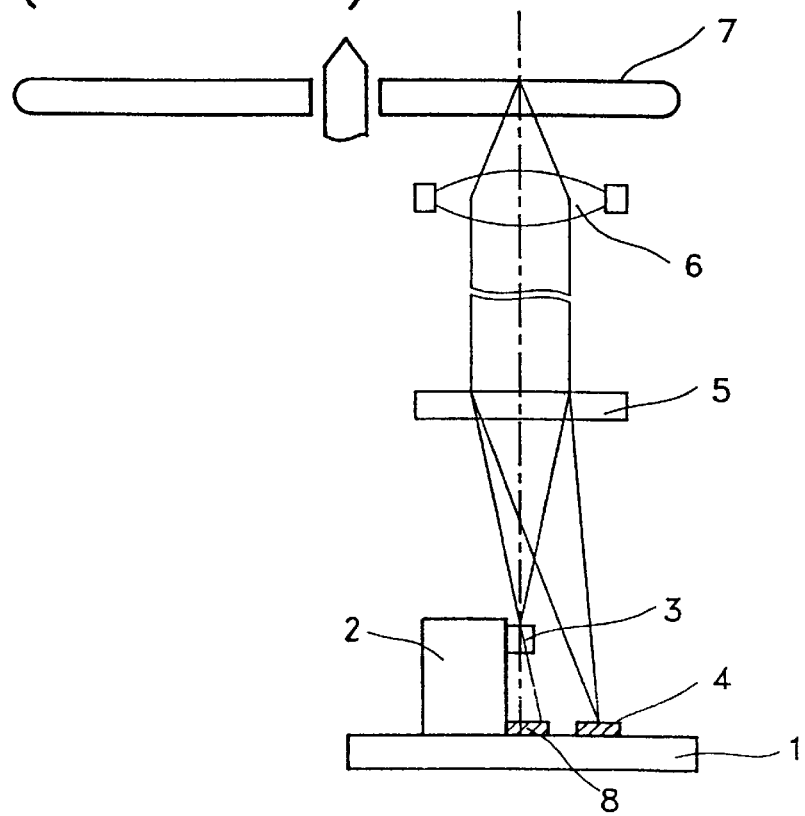
FIG. 1 is a diagram of an optical system employing a conventional hologram optical pickup.
Figure 2:
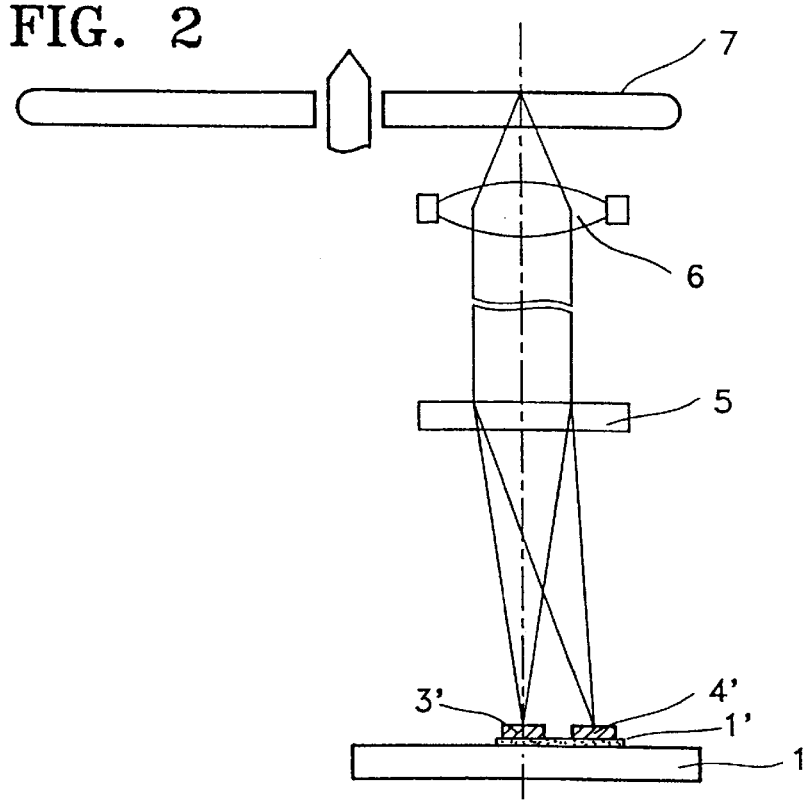
FIG. 2 is a diagram of an optical system employing an optical pickup in accordance with one embodiment of the present invention.

FIG. 2 is an illustration of an optical system employing an optical pickup in accordance with one embodiment of the present invention. As shown in the figure, the pickup comprises a printed circuit board (PCB) 1, a single chip 1', a vertical cavity surface-emitting laser (VCSEL) diode 3', and a photodetector 4'. The single chip 1' is mounted on the PCB 1, and the VCSEL diode 3' is mounted on the single chip 1' and used as a light source. Furthermore, the photodetector 4 is disposed adjacent to the VCSEL diode 3' on the chip 1' and detects light which has been emitted from the diode 3' and reflected off an optical disk 7.

The optical pickup further comprises a hologram device 5 and an objective lens 6. The hologram device 5 and the objective lens intersect the optical axis of the diode 3' and are located between the diode 3' and the disk 7.

The operation of the optical pickup illustrated in FIG. 2 will be described below. First, the VCSEL diode 3' emits a laser beam having multiform polarization directions, and such beam impinges upon the hologram device 5. The device 5 converts the laser beam into a parallel light beam and outputs such beam to the objective lens 6. Then, the lens 6 focuses the light beam upon a particular track of the disk 7.

The focused beam reflects off the track of the optical disk 7, and the polarization of the light beam varies according to information recorded in the track. Afterwards, the reflected beam passes through the objective lens 6, is converted into a parallel beam, and is output to the hologram device 5. Subsequently, the device 5 diffracts the reflected beam and outputs the diffracted beam to the photodetector 4'. As a result, the photodetector 4' may determine the type of information recorded on the track of the disk 7 based on the shape and/or intensity of the diffracted beam. Also, the photodetector 4 may evaluate the beam to determine if the beam is properly positioned on the track of the disk and/or if the beam is properly focused on the disk 7.

Figure 4A:
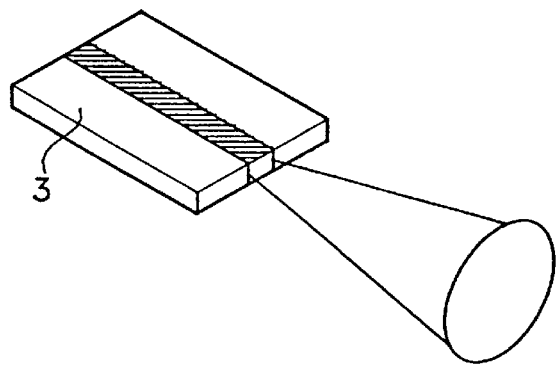
FIG. 4A illustrates an output beam of an edge-emitting laser diode.
Figure 4B:
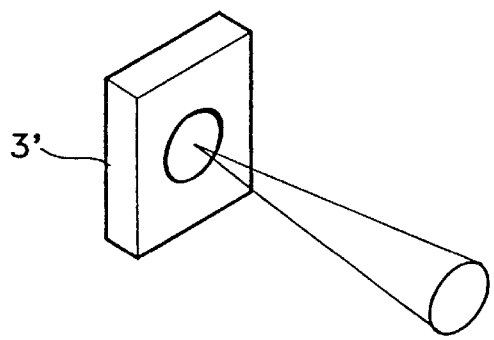
FIG. 4B illustrates an output beam of a VCSEL diode.

Since the beam emitted from the VCSEL diode 3' has a relatively little astigmatism and a single mode, accurately determining if the emitted laser beam is properly focused and/or correctly positioned on the track of the optical disk 7 is facilitated. For example, as shown in FIG. 4B, the light beam emitted from the VCSEL diode 3' is circular, has a single mode, and has a relatively small astigmatism. On the other hand, as shown in FIG. 4A, the light emitted from the conventional edge-emitting laser diode 3 is oval and has a relatively large astigmatism. As a result, the amount of light which is diffused in an optical system employing the optical pickup of the present embodiment is much less than the amount of light diffused in a system using a conventional pickup. Consequently, the photodetector 4' contained in optical system shown in FIG. 2 can detect variations in the diffracted beam significantly better than the photodetector 4 of the conventional pickup.

Also, the optical pickup of the present embodiment is easier to produce because the diode 3' and the photodetector 4' can be produced via a single process. Furthermore, the optical axes of the diode 3' and the photodetector 4' may be simultaneously controlled during the assembly process because the two devices 3' and 4' can be made from identical VCSEL diodes. In particular, the VCSEL diode can be used as both a light source and a photodetector. For instance, a VCSEL diode can be used as the photodetector by merely using an absorption increasing effect and an absorption enhancement effect. The absorption increasing effect is generated by applying a reverse bias voltage across the VCSEL diode, and an absorption enhancement effect is created via multiple-reflection mirrors. By using multiple-reflection mirrors, a decrease in the light absorption efficiency, which occurs due to a thin absorbing layer (e.g. 100 Å), is prevented. As a result, the light source and the photodetector may have the identical structure and may be disposed on the same PCB. Thus, the two devices can be integrated into a single chip.

Figure 3:
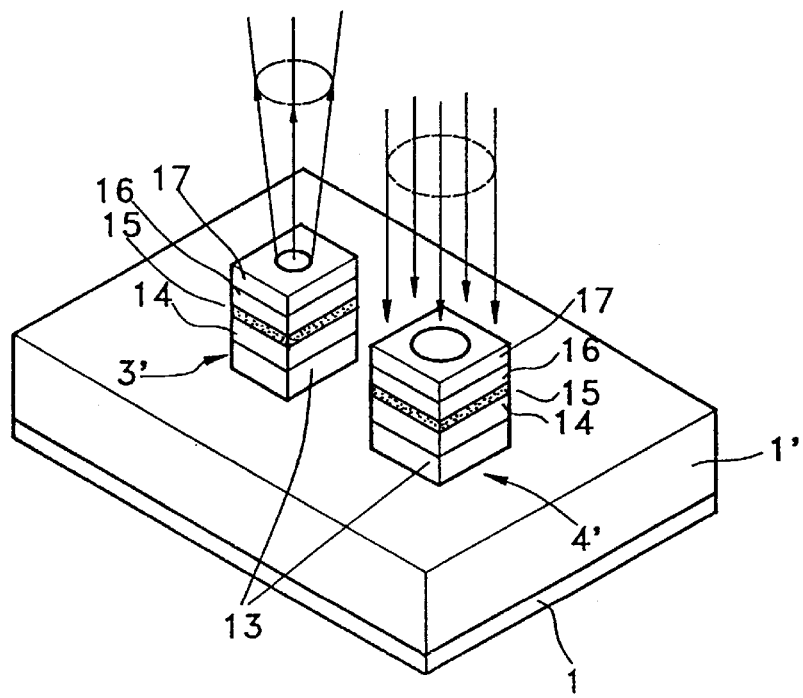
FIG. 3 is a perspective view of a vertical cavity surface-emitting laser (VCSEL) diode and a photodetector used in the embodiment illustrated in FIG. 2.

FIG. 3 shows an example of a detailed view of the VCSEL diode 3' and the photodetector 4' which have the same structure and which are disposed on the single chip 1'. In this instance, a reverse bias voltage is applied to the photodetector 4' to prevent it from emitting a laser.

Figure 5:
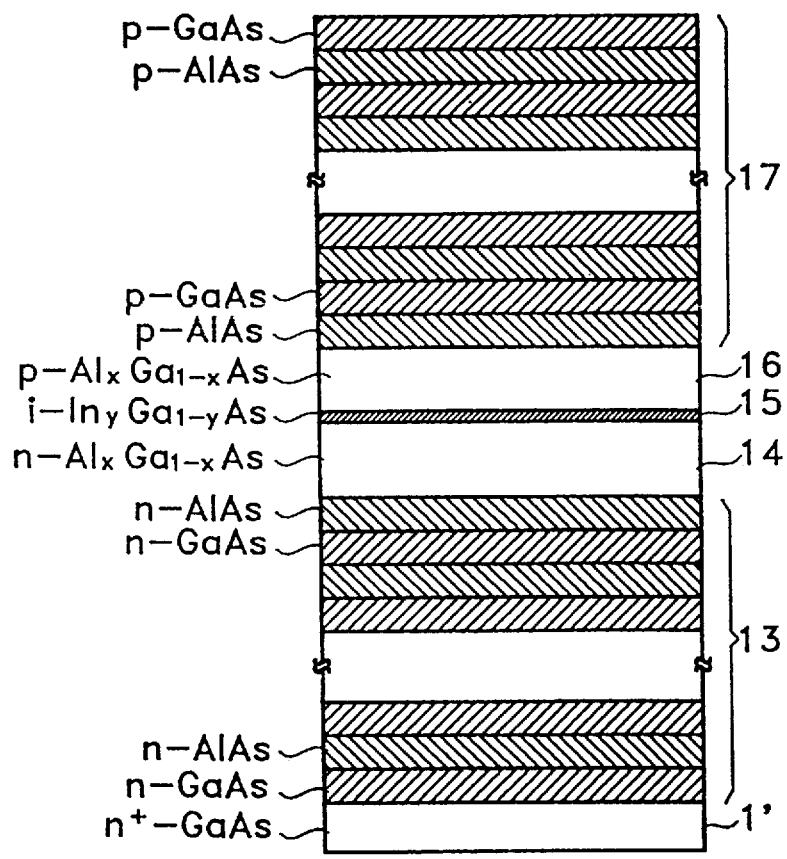
FIG. 5 is a sectional view of the VCSEL diode shown in FIG. 3.

An example of the cross section of the VCSEL diode 3' or the photodetector 4' illustrated in FIG. 3 is shown in FIG. 5. Specifically, the molecular beam epitaxy (MBE) type VCSEL diode can be a light source or a photodetector and comprises lower reflection mirror layers 13, a lower space layer 14, an activated layer 15, and upper spacer layer 16, and upper reflection mirror layers 17. The lower reflection mirror layers 13 comprise n-GaAs layers and n-AlAs layers which are alternatively stacked. The lower spacer layer 14 is formed of n-$Al_xGa_{1-x}As$. The activated layer 15 is made of i-$In_yGa_{1-y}As$. The upper spacer layer 16 formed of p-$Al_xGa_{1-x}As$. Finally, the upper reflection mirror layers 17 are formed of p-AlAs layers and p-GaAs layers which are alternatively stacked.

The MBE type surface-emitting laser diode is grown by an MBE method and is roughly divided into two reflection mirrors and an activated layer as in a general laser diode. The activated layer 15 is the light emitting portion and is formed of four GaAs quantum wells which are 100 Å thick. Moreover, the activated layer 15 emits light having a wavelength of approximately 8500 Å. Furthermore, the quantum wells can effectively contribute to a laser emitting mode by being located at a portion which has a maximum light wave amplitude in the middle of a Fabry-Perot cavity.

The maximum gain of a laser beam which is available from the four quantum wells is about 0.01. Therefore, the reflection rates of the lower reflection mirror layers 13 and the upper reflection mirror layers 17 should be at least 99%. Also, the lower reflection mirror layers 13 should be Si-doped and the upper reflection mirror layers 17 should be Be-doped (p type). During the Be-doping process, the upper portion of the diode 3' is controlled to have a larger doping density than that of the lower portion of the diode 3'. Furthermore, the wavelength of the laser emitted from the diode 3' is determined by the thicknesses of the lower spacer layer 14 and the upper spacer layer 16.

As demonstrated above, optical pickups using VCSEL diodes are advantageous because the VCSEL diodes can be used as a light source and a photodetector and can be produced by the same manufacturing process. However, the VCSEL diode used as a photodetector may include a bragg mirror having a reflection rate of over 99.6% in the upper portion thereof. Thus, detecting signals may be difficult because a lower amount of reflected light may reach the activated layer of the photodetector.

Figure 6:
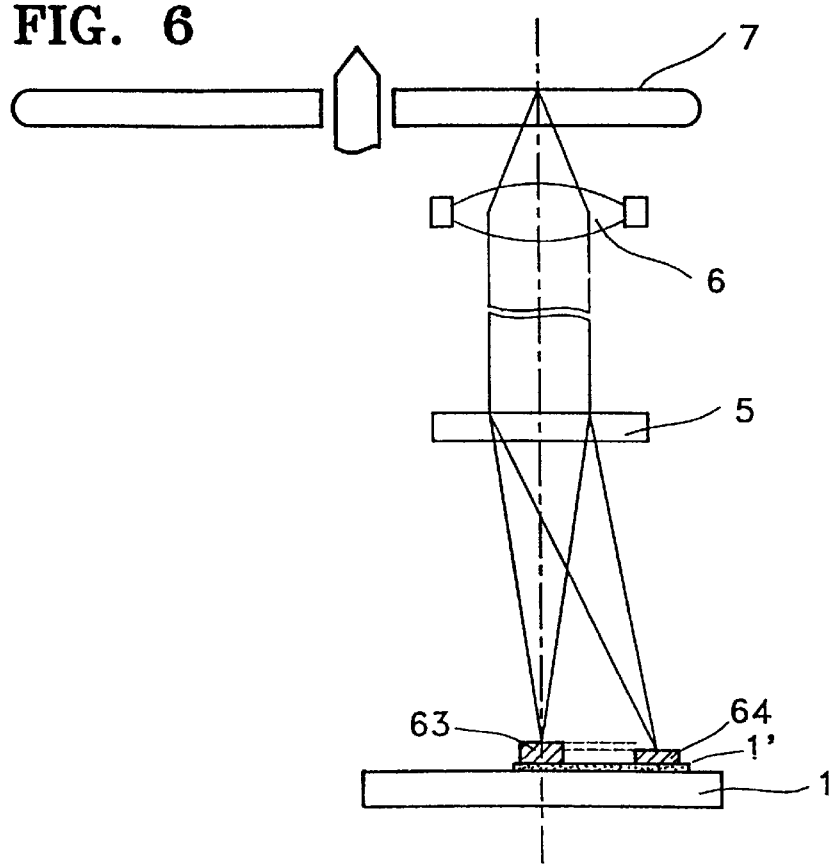
FIG. 6 is a diagram of an optical system employing an optical pickup in accordance with another embodiment of the present invention.
Figure 7:
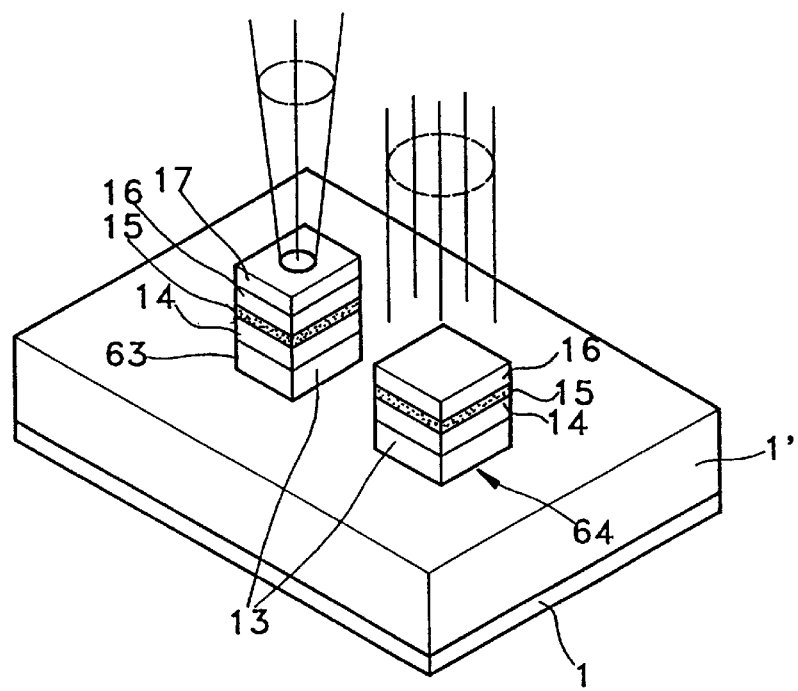
FIG. 7 is a perspective view of a VCSEL diode and a photodetector used in the embodiment illustrated in FIG. 6.
Figure 9:
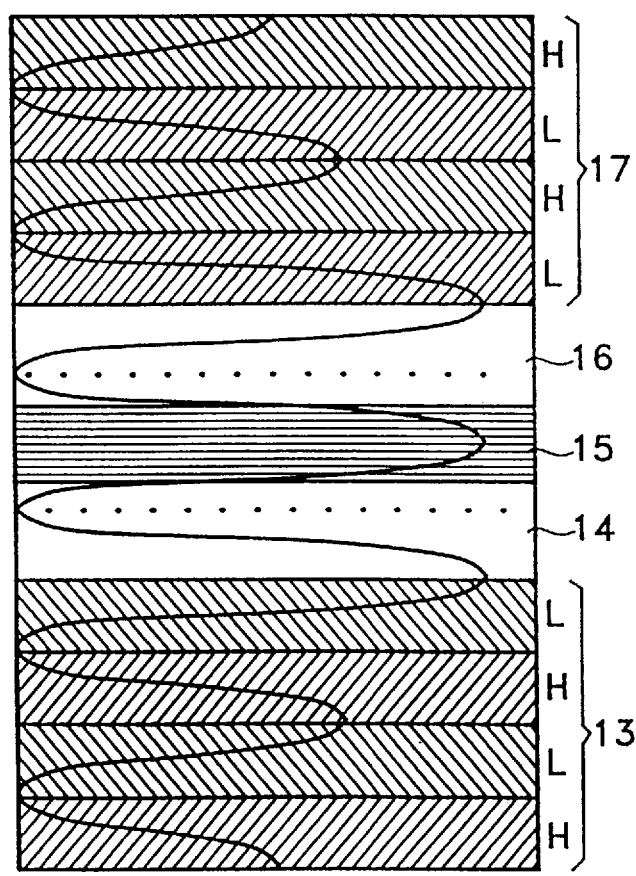
FIG. 9 is a diagram of the intensity distribution of a sinusoidal wave in a VCSEL diode.

In order to overcome such problem, an optical system may incorporate an optical pickup in accordance with a second embodiment as illustrated in FIGS. 6, 7, and 9. (In FIGS. 6, 7, and 9, the same reference numerals as those of FIGS. 2, 3, and 5 represent the same elements).

In the embodiment illustrated in FIG. 6, the optical pickup comprises a PCB 1, a semiconductor substrate 1', a hologram device 5, an objective lens 6, a VCSEL diode 63, and a photodetector 64. Such elements are arranged in manner similar to the manner in which the corresponding elements illustrated in FIG. 2 are arranged.

FIG. 7 is a magnified perspective view of the VCSEL diode 63 and the photodetector 64 which are fixedly disposed on a single chip. As shown in the figure, diode 63 comprises lower reflection mirror layers 13, a lower spacer layer 14, an activated layer 15, an upper surface spacer 16, and upper reflection mirror layers 17. The lower reflection mirror layers 13 are formed of n-GaAs layers and n-AlAs layers which are alternatively stacked. The lower spacer layer 14 is formed of n-$Al_xGa_{1-x}As$. The activated layer 15 is made of i-$In_yGa_{1-y}As$. The upper spacer layer 16 is formed of p-Al$_x$Ga$_{1-x}$As. Finally, the upper reflection mirror layers 17 are formed of p-AlAs layers and p-GaAs layers which are alternatively stacked.

The MBE type surface-emitting laser diode is grown by an MBE method and is roughly divided into two reflection mirrors and an activated layer as in a general laser diode. The activated layer 15 is the light emitting portion and is formed of four GaAs quantum wells which are 100 Å thick. Moreover, the activated layer 15 emits light having a wavelength of approximately 8500 Å. Furthermore, the quantum wells can effectively contribute to a laser emitting mode by being located at a portion which has a maximum light wave amplitude in the middle of a Fabry-Perot cavity.

The maximum gain of a laser beam which is available from the four quantum wells is about 0.01. Therefore, the reflection rates of the lower reflection mirror layers 13 and the upper reflection mirror layers 17 should be at least 99%. Also, the lower reflection mirror layers 13 should be Si-doped and the upper reflection mirror layers 17 should be Be-doped (p type). During the Be-doping process, the upper portion of the diode 63 is controlled to have a larger doping density than that of the lower portion of the diode 63. Furthermore, the wavelength of the laser emitted from the diode 63 is determined by the thicknesses of the lower spacer layer 14 and the upper spacer layer 16.

The photodetector 64 is formed by etching away a portion or all of the upper reflection mirror layers 17 from the VCSEL diode 63. As a result, the reflection rate at the upper portions of the photodetector 64 is sharply reduced, and thus, the intensity of light reaching the activated layer 15 can be increased. By improving the sensitivity of the photodetector, accuracy of the optical pickup is significantly increased, and the reproduction of information becomes more precise.

In another embodiment of the present invention, the photodetector is not formed of the VCSEL diode but instead is formed of a photo diode. When the photodetector is formed of the photo diode, the manner in which the diode is driven becomes simpler because a reverse bias voltage does not need to be applied.

Figure 8:
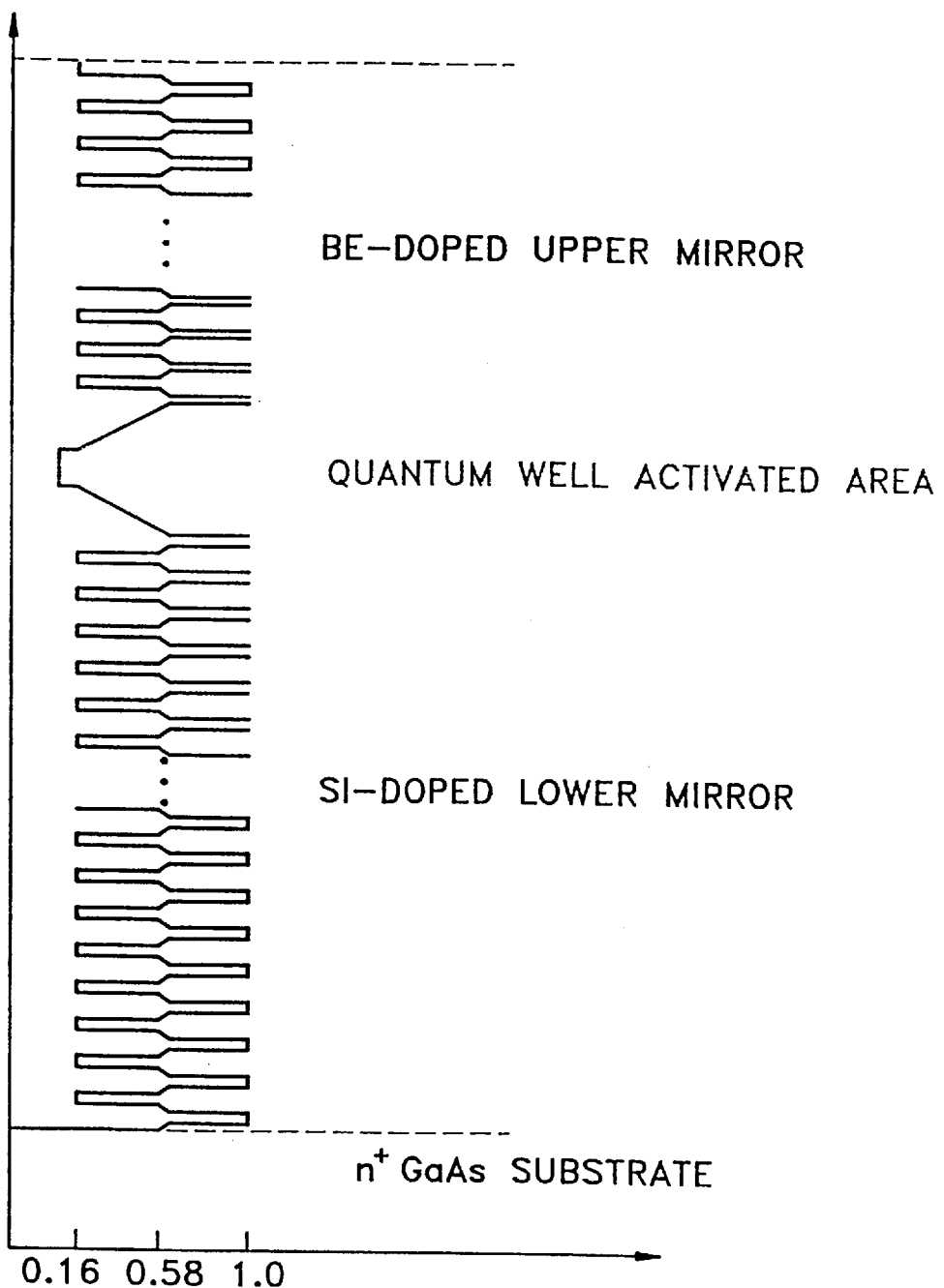
FIG. 8 is a diagram of the vertical crystal growth of a VCSEL diode.

The vertical crystal growth of the VCSEL diode 63 used as a light source has the structure shown in FIG. 8. Furthermore, the vertical crystal growth of the surface-emitting laser diode used as the photodetector 64 has a structure in which a portion or all of the upper Be-doping upper reflection mirror layers are removed from the structure shown in FIG. 8. The distribution of intensity of a sinusoidal wave within a VCSEL diode is shown in FIG. 9.

As described above, the optical pickup of the present embodiment produces a laser beam which has a small astigmatism. Moreover, the detection capabilities of the pickup is further enhanced by removing a portion or all of the upper reflection mirror layers of the VCSEL diode used as a photodetector. In addition, when the light source and the photodetector are integrated on a single chip, the reduction of the intensity of light reflected from a disk is sharply decreased.

What is claimed is:

1. An optical pickup for detecting information contained in an optical disk, comprising:
    a light source formed of a first vertical cavity surface-emitting laser (VCSEL) diode, wherein said light source emits a light beam;
    a hologram device, wherein said hologram device converts said light beam emitted from said light source into a polarized parallel light beam and wherein said hologram device diffracts a reflected parallel light beam reflected from said optical disk to produce a diffracted beam;
    an objective lens, wherein said objective lens focuses said polarized parallel light beam on said optical disk;
    a photodetector formed of a second VCSEL diode for detecting said diffracted beam; and
    a chip on which said light source and said photodetector are integrated;
    wherein said first VCSEL diode is formed of lower reflection mirror layers, a lower spacer layer disposed on said lower reflection mirror layers, an activated layer disposed on said lower spacer layer, an upper spacer layer disposed on said activated layer, upper reflection mirror layers disposed on said upper spacer layer, and
    wherein said VCSEL diode used as said photodetector is formed identical to said light source.

2. An optical pickup as claimed in claim 1, wherein a reverse bias voltage is applied to said photodetector.

3. An optical pickup as claimed in claim 1, wherein said upper reflection mirror layers and said lower reflection mirror layers are formed of multiplex reflectors having multilayer structures.

4. An optical pickup as claimed in claim 1, wherein said photodetector is formed of a photo diode.

5. An optical pickup for detecting information contained in an optical disk, comprising:
    a light source formed of a first vertical cavity surface-emitting laser (VCSEL) diode, wherein said light source emits a laser beam towards said optical disk;
    a photodetector for detecting a reflected beam reflected from said optical disk; and
    a chip on which said light source and said photodetector are integrated.

6. An optical pickup as claimed in claim 5, wherein said photodetector is formed of a second VCSEL diode.

7. An optical pickup as claimed in claim 6, wherein said second VCSEL diode is identical to said first VCSEL diode.

8. An optical pickup as claimed in claim 5, wherein said photodetector is a photo diode.

9. An optical pickup as claimed in claim 5, wherein said first VCSEL diode comprises:
    lower reflection mirror layers;
    upper reflection mirror layers; and
    an activated layer disposed between said upper reflection mirror layers and said lower reflection mirror layers.

10. An optical pickup as claimed in claim 9, wherein said first VCSEL diode further comprises:
    a lower spacer layer disposed between said lower reflection mirror layers and said an activated layer; and
    an upper spacer layer disposed between said activated layer and said upper reflection mirror layers.

11. An optical pickup as claimed in claim 9, wherein said photodetector is formed of a second VCSEL diode which is identical to said first VCSEL diode.

12. An optical pickup as claimed in claim 9, wherein said photodetector is formed of a second VCSEL diode which is formed by creating an intermediate VCSEL diode which is identical to said first VCSEL diode and by subsequently removing at least a portion of said upper reflection mirror layers.

13. An optical pickup as claimed in claim 10, wherein said photodetector is formed of a second VCSEL diode which is identical to said first VCSEL diode.

14. An optical pickup as claimed in claim 10, wherein said photodetector is formed of a second VCSEL diode which is formed by creating an intermediate VCSEL diode which is identical to said first VCSEL diode and by subsequently removing at least a portion of said upper reflection mirror layers.

15. An optical pickup as claimed in claim 9, wherein said lower reflection mirror layers comprise n-GaAs layers and n-AlAs layers, wherein said n-GaAs layers and said n-AlAs layers are alternatively stacked, wherein said upper reflection mirror layers comprise p-GaAs layers and p-AlAs layers, wherein said p-GaAs layers and said p-AlAs layers are alternatively stacked, and wherein said activated layer comprises a i-$In_yGa_{1-y}As$ layer.

16. An optical pickup as claimed in claim 10, wherein said lower reflection mirror layers comprise n-GaAs layers and n-AlAs layers, wherein said n-GaAs layers and said n-AlAs layers are alternatively stacked, wherein said upper reflection mirror layers comprise p-GaAs layers and p-AlAs layers, wherein said p-GaAs layers and said p-AlAs layers are alternatively stacked, and wherein said activated layer comprises a i-$In_yGa_{1-y}As$ layer.

17. An optical pickup as claimed in claim 16, wherein said lower spacer layer comprises a n-$Al_xGa_{1-x}As$ layer and said upper spacer layer comprises a p-$Al_xGa_{1-x}As$ layer.

18. An optical pickup as claimed in claim 6, wherein said second VCSEL diode comprises:

lower reflection mirror layers;

upper reflection mirror layers; and an activated layer disposed between said upper reflection mirror layers and said lower reflection mirror layers.

19. An optical pickup as claimed in claim 18, wherein said second VCSEL diode further comprises:

a lower spacer layer disposed between said lower reflection mirror layers and said an activated layer; and an upper spacer layer disposed between said activated layer and said upper reflection mirror layers.

20. An optical pickup as claimed in claim 6, wherein said second VCSEL diode is formed by creating an intermediate VCSEL diode which comprises lower reflection mirror layers, upper reflection mirror layers, and an activated layer disposed between said upper reflection mirror layers and said lower reflection mirror layers and by subsequently removing at least a portion of said upper reflection mirror layers.

21. A method of forming a light source and a photodetector for an optical pickup, wherein said light source emits a light beam at least indirectly towards an optical medium containing data and wherein said photodetector detects a reflected beam which is at least indirectly reflected from said optical medium, said method comprising the steps of:

(a) forming said light source on a chip, wherein said light source is formed of a first vertical cavity surface emitting laser (VCSEL) diode; and (b) forming said photodetector on said chip such that said light source and said photodetector are integrated together on said chip, wherein said step (a) comprises the steps of:

(a1) forming lower reflection mirror layers of said first VCSEL diode;

(a2) forming upper reflection mirror layers of said first VCSEL diode; and (a3) forming an activated layer between said upper reflection mirror layers and said lower reflection mirror layers.

22. The method as claimed in claim 21, wherein said step (a) further comprises the steps of:

(a4) forming a lower spacer layer between said lower reflection mirror layers and said an activated layer; and (a5) forming an upper spacer layer between said activated layer and said upper reflection mirror layers.

23. The method as claimed in claim 21, wherein said step (b) comprises the step of:

(b1) forming said photodetector from a second VCSEL diode.

24. The method as claimed in claim 23, wherein said step (b1) comprises the step of:

(b1a) forming said photodetector from said second VCSEL diode which is identical to said first VCSEL diode.

25. The method as claimed in claim 24, wherein said step (b1) further comprises the step of:

(b1b) removing at least an upper portion of said second VCSEL diode.

26. The method as claimed in claim 25, wherein said step (b1a) comprises the step of:

(b1a1) forming said second VCSEL diode from the same process by which said first VCSEL diode is formed and at the same time that said first VCSEL diode is formed.

27. The method as claimed in claim 21, wherein said step (b) comprises the step of:

(b1) forming said photodetector from a second VCSEL diode which is identical to said first VCSEL diode.

28. The method as claimed in claim 27, wherein said lower reflection mirror layers comprise n-GaAs layers and n-AlAs layers, wherein said n-GaAs layers and said n-AlAs layers are alternatively stacked, wherein said upper reflection mirror layers comprise p-GaAs layers and p-AlAs layers, wherein said p-GaAs layers and said p-AlAs layers are alternatively stacked, and wherein said activated layer comprises a i-$In_yGa_{1-y}As$.

29. The method as claimed in claim 28, wherein said step (a) further comprises the steps of:

(a4) forming a lower spacer layer between said lower reflection mirror layers and said an activated layer, wherein said lower spacer layer comprises an n-$Al_xGa_{1-x}As$ layer; and (a5) forming an upper spacer layer between said activated layer and said upper reflection mirror layers, wherein said upper spacer layer comprises a p-$Al_xGa_{1-x}As$ layer.

30. The method as claimed in claim 27, wherein said step (b1) further comprises the step of:

(b1a) removing at least a portion of said upper reflection mirror layers of said second VCSEL diode.

31. The method as claimed in claim 30, wherein said step (b) comprises the step of:

(b2) forming said second VCSEL diode from the same process by which said first VCSEL diode is formed and at the same time that said first VCSEL diode is formed.

* * * * *